US012813196B2

(12) United States Patent
Cheng et al.

(10) Patent No.: US 12,813,196 B2
(45) Date of Patent: Nov. 24, 2026

(54) HEAT REFLECTION ASSEMBLY FOR SUBSTRATE TEMPERATURE UNIFORMITY

(71) Applicant: Applied Materials, Inc., Santa Clara, CA (US)

(72) Inventors: Cheng Cheng, Santa Clara, CA (US); Dongming Iu, Union City, CA (US); Xi Cen, San Jose, CA (US); Kai Wu, Palo Alto, CA (US); Yao Xu, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 363 days.

(21) Appl. No.: 18/395,343

(22) Filed: Dec. 22, 2023

(65) Prior Publication Data

US 2025/0210381 A1 Jun. 26, 2025

(51) Int. Cl.
*H10P 72/00* (2026.01)
*H10P 72/76* (2026.01)

(52) U.S. Cl.
CPC ...... *H10P 72/0434* (2026.01); *H10P 72/7624* (2026.01)

(58) Field of Classification Search
None
See application file for complete search history.

(56) References Cited

U.S. PATENT DOCUMENTS

| | | | | |
|---|---|---|---|---|
| 2004/0079746 A1* | 4/2004 | Jennings | H10P 72/0602 219/390 |
| 2016/0258061 A1 | 9/2016 | Tsai et al. | |
| 2022/0333239 A1* | 10/2022 | Saurabh | C23C 16/4583 |
| 2023/0130756 A1* | 4/2023 | Huang | H10P 72/0432 118/724 |

FOREIGN PATENT DOCUMENTS

| | | | |
|---|---|---|---|
| KR | 10-2017-0138359 A | 12/2017 | |
| KR | 20170138359 A * | 12/2017 | H10P 72/7624 |
| WO | 00-41223 A1 | 7/2000 | |
| WO | 2019-032457 A1 | 2/2019 | |
| WO | 2020-092046 A1 | 5/2020 | |

OTHER PUBLICATIONS

International Search Report and Written Opinion dtd Apr. 1, 2025 for Application No. PCT/US2024/060391.

* cited by examiner

Primary Examiner — Steven S Anderson, II
(74) *Attorney, Agent, or Firm* — Patterson + Sheridan, LLP

(57) ABSTRACT

The disclosure generally includes a heat reflection assembly for improved deposition uniformity in semiconductor manufacturing. In one embodiment, a heat reflection assembly for semiconductor manufacturing is provided. The heat reflection assembly includes a reflector plate and a first tuning element. The reflector plate includes a first surface having a first region with a first emissivity. The first tuning element is disposed on the first surface of the reflector plate. The first tuning element includes a reflecting surface having a second emissivity different than the first emissivity.

17 Claims, 9 Drawing Sheets

HEAT REFLECTION ASSEMBLY FOR SUBSTRATE TEMPERATURE UNIFORMITY

BACKGROUND

Field

Embodiments described herein generally relate to the field of semiconductor device manufacturing, and more particularly, to apparatus and methods for implementing an enhanced reflector plate assembly.

Description of the Related Art

Variation in substrate heating may lead to variations in substrate temperature and deposition non-uniformity. Substrates exhibiting such non-uniformities may produce devices of reduced quality. Further, heat lost to other areas of the chamber and not received by the substrate increase power consumption. The added load increases production costs.

Accordingly, there is a need in the art for improved apparatus and methods for implementing an enhanced reflector plate assembly.

SUMMARY

This disclosure relates to a enhance deposition uniformity for semiconductor manufacturing. In one embodiment, a heat reflection assembly for semiconductor manufacturing is provided. The heat reflection assembly includes a reflector plate and a first tuning element. The reflector plate includes a first surface having a first region with a first emissivity. The first tuning element is disposed on the first surface of the reflector plate. The first tuning element includes a reflecting surface having a second emissivity different than the first emissivity.

In another embodiment, a processing chamber for semiconductor manufacturing is provided. The processing chamber includes a substrate support, a heat reflection assembly, and a first tuning element. The Substrate support is disposed in a processing volume of the processing chamber and includes a support column and a heater disposed within the substrate support. The heat reflection assembly includes a reflector plate with a first surface having a first region with a first emissivity. The first tuning element is disposed on the first surface of the reflector plate. The first tuning element includes a reflecting surface, the reflecting surface having a second emissivity different than the first emissivity.

In another embodiment, a processing chamber for semiconductor manufacturing is provided. The processing chamber includes a substrate support and a heat reflection assembly. The substrate support is disposed in a processing volume of the processing chamber. The substrate support includes a support column and a heater disposed within the substrate support. The heat reflection assembly, wherein the heat reflection assembly is configured to enable movement of the substrate support independent of the heat reflection assembly. The heat reflection assembly includes a reflector plate, a shaft aperture, a first tuning element, and one or more tuning apertures disposed radially outward of the shaft aperture. The reflector plate has a first surface. The first surface has a first region having a first emissivity and a second region having a second emissivity less than the first emissivity. The first tuning element is disposed on the first surface of the reflector plate and includes a reflecting surface with a third emissivity greater than the first emissivity.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the disclosure, and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to semiconductor deposition apparatus, and related methods, modules, and components to enhance deposition uniformity and chamber efficiency. The present disclosure includes embodiments to tune a deposition process through temperature adjustments in response to adjustments to the emissivity of surfaces of a heat reflection assembly.

The disclosure contemplates that terms such as "couples," "coupling," "couple," and "coupled" may include but are not limited to bonding, embedding, welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links, blocks, and/or frames.

Figure 1:
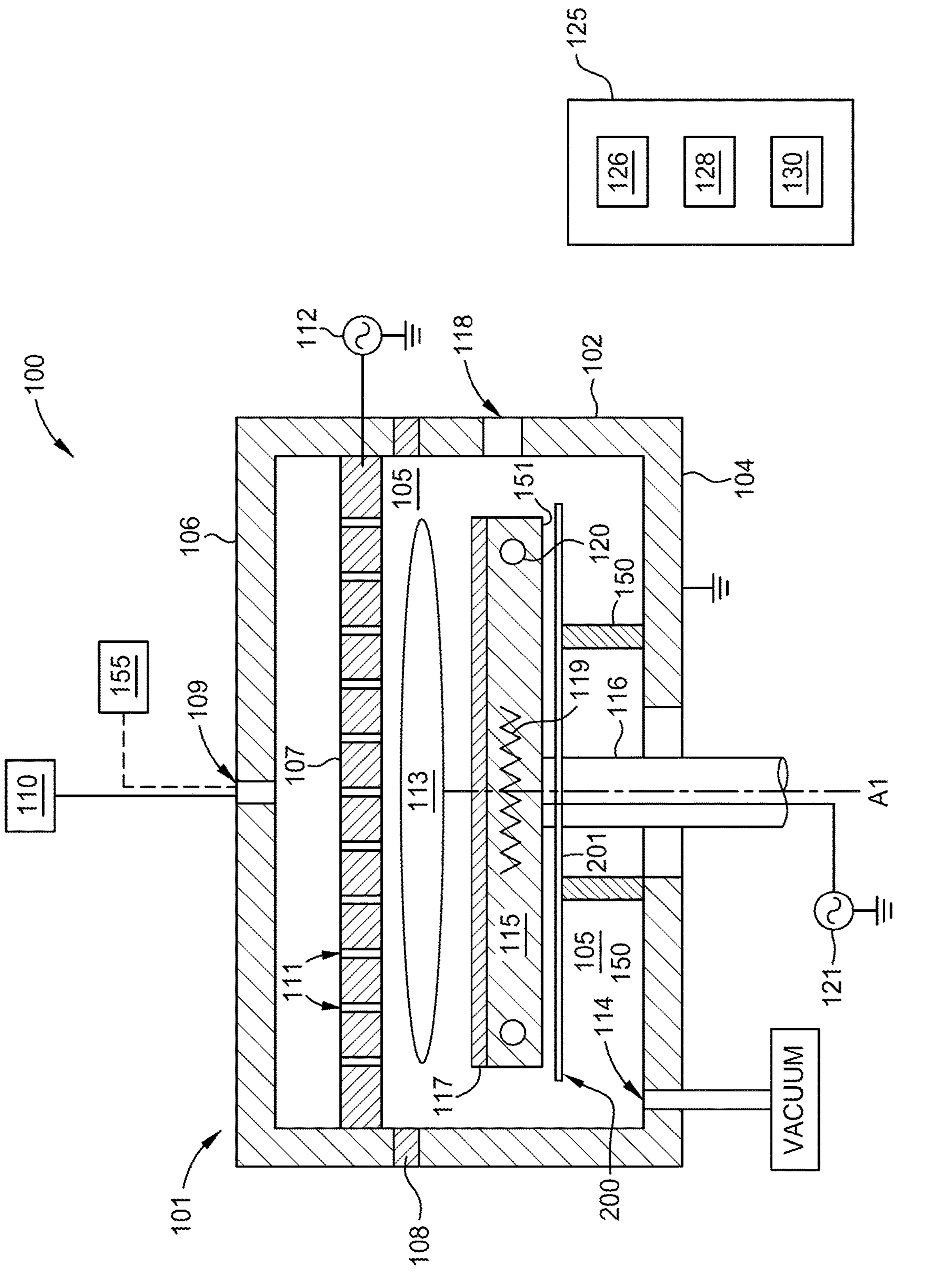
FIG. 1 is a schematic cross-sectional view of an exemplary processing chamber according to one or more embodiments.

FIG. 1 is a schematic cross sectional view of an exemplary processing chamber 100, according to one or more embodiments.

The processing chamber 100 includes a chamber lid assembly 101, one or more sidewalls 102, and a chamber base 104. The chamber lid assembly 101 includes a chamber lid 106, a showerhead 107 disposed in the chamber lid 106, and an electrically insulating ring 108, disposed between the chamber lid 106 and the one or more sidewalls 102. The showerhead 107, the one or more sidewalls 102, and the chamber base 104 together define a processing volume 105.

The processing chamber 100 includes a gas inlet 109, disposed through the chamber lid 106 and fluidly coupled to a gas source 110. The showerhead 107 has a plurality of openings 111 disposed therethrough and is used to uniformly distribute processing gases from the gas source 110 into the processing volume 105. In some embodiments, the showerhead 107 is electrically coupled to a first power supply 112, such as an RF power supply, which supplies power to ignite and maintain a plasma 113 of the processing gas through capacitive coupling. In some embodiments, the processing chamber 100 comprises an inductive plasma generator and the plasma is formed through inductively coupling an RF power to the processing gas.

The processing volume 105 is fluidly coupled to a vacuum source through a vacuum outlet 114, which maintains the processing volume 105 at sub-atmospheric conditions and evacuates the processing gas and other gases.

The processing chamber 100 includes a substrate support 115 disposed in the processing volume 105. The substrate support 115 is disposed on a movable support column 116 extending through the chamber base 104, such as being surrounded by bellows (not shown) in the region below the chamber base 104. The processing chamber 100 is configured to facilitate transferring a substrate 117 to and from the substrate support 115 through an opening 118 in one of the one or more sidewalls 102, which is conventionally sealed with a door or a valve (not shown) during substrate processing.

The substrate 117 is disposed on the substrate support 115 and is maintained at a desired processing temperature by a heater 119 disposed in the substrate support 115 and one or more cooling channels 120 disposed in the substrate support 115. The heater 119 may be a resistive heater.

Operation of the processing chamber 100 is facilitated by a system controller 125. They system controller 125 includes a programmable central processing unit (CPU) 126, which is operable with a memory 128 (e.g., non-volatile memory) and support circuits 130. The CPU 126 is one of any form of general purpose computer processor used in an industrial setting, such as a programmable logic controller (PLC), for controlling various chamber components and sub-processors. The memory 128, coupled to the CPU 126, facilitates the operation of the processing chamber 100. The support circuits 130 are conventionally coupled to the CPU 126 and comprise cache, clock circuits, input/output subsystems, power supplies, and the like, and combinations thereof coupled to the various components the processing chamber, to facilitate control of substrate processing operations therewith.

The instructions in the memory 128 are in the form of a program product such as a program that implements the methods of the present disclosure. In one example, the disclosure may be implemented as a program product stored on computer-readable storage media for use with a computer system. The program(s) of the program product define functions of the embodiments (including the methods described herein). Thus, the computer-readable storage media, when carrying computer-readable instructions that direct the functions of the methods described herein, are embodiments of the present disclosure.

The processing chamber 100 further comprises a heat reflection assembly 200 disposed on one or more supports 150. The one or more supports 150 allow the substrate support 115 to translate independent of the heat reflection assembly 200 such that the heat reflection assembly 200 is configured to enable movement of the substrate support 115 independent of the heat reflection assembly 200. The one or more supports 150 dispose the heat reflection assembly 200 about 0.01 inch to about 3 inches from a bottom surface 151 of the substrate support 115.

The heat reflection assembly 200 includes a reflector plate 201 disposed around the support column 116. The heat reflection assembly 200 is disposed between the chamber base 104 and the substrate support 115. The heat reflection assembly 200 is disposed around a vertical axis A1. The heat reflection assembly 200 is described in more detail below.

The vertical axis A1 is co-axial with the center of the substrate 117 and with the support column 116. The substrate support 115 translates along the vertical axis A1.

As heat from the heater 119 radiates from the substrate support 115, the heat translates to the substrate 117 and other parts of the processing chamber 100. The heat reflection assembly 200 reflects the heat back towards the substrate support 115 and substrate 117 to enhance the efficiency of the processing chamber 100. Surfaces of the heat reflection assembly 200 with higher emissivity correspond to lower deposition thickness on the substrate 117 and conversely surfaces with lower emissivity correspond to higher deposition thickness on the substrate 117. This concept can be applied to the heat reflection assembly 200 to tune a deposition process for enhanced deposition uniformity.

Figure 2:
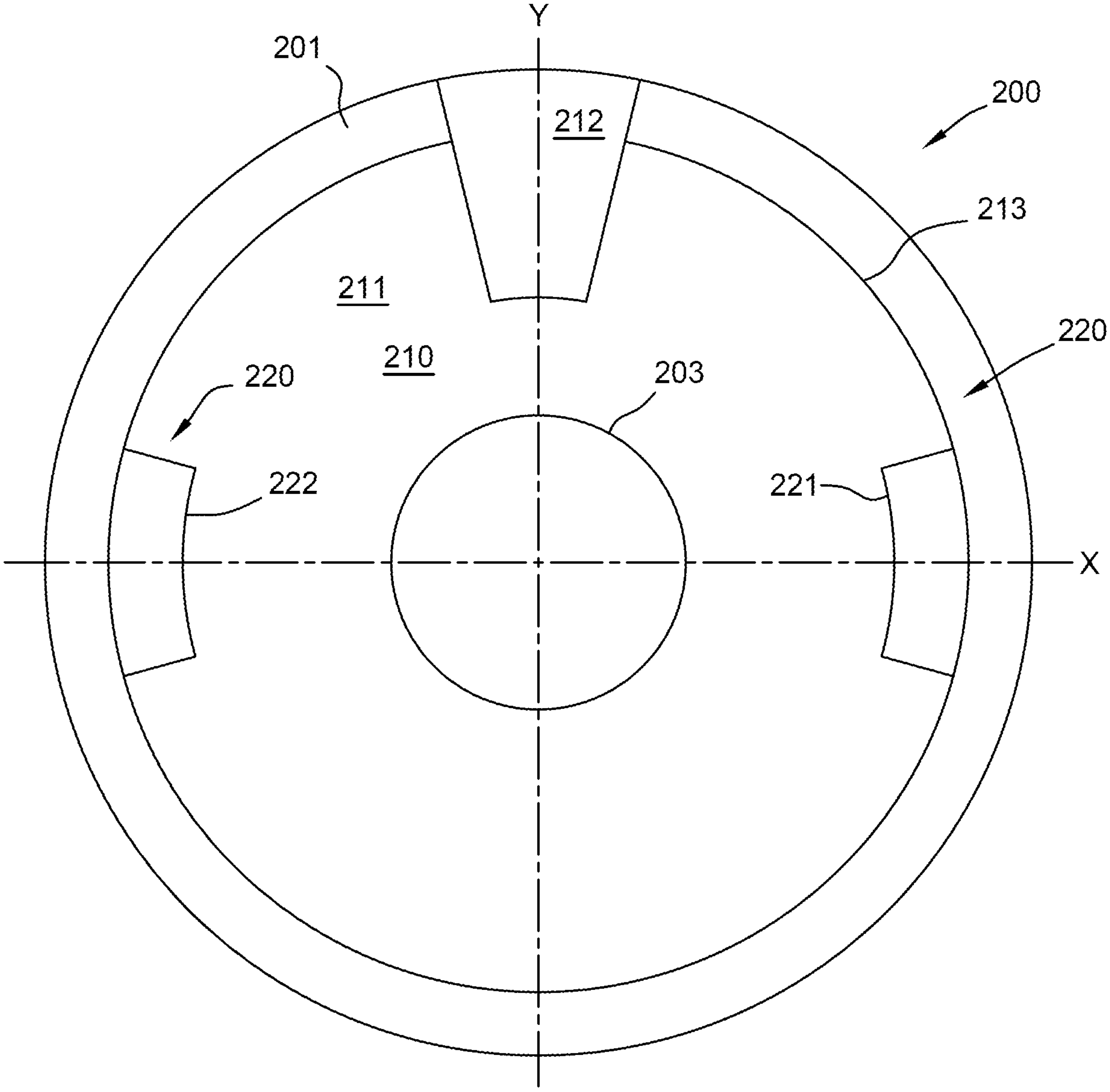
FIG. 2 is a schematic top view of an exemplary heat reflection assembly according to one or more embodiments.

FIG. 2 is a schematic top view of an exemplary heat reflection assembly 200 according to one or more embodiments.

The heat reflection assembly 200 includes the reflector plate 201 and one or more tuning elements 220. The one or more tuning elements 220 include a first tuning element 221. As illustrated in FIG. 2, the reflector plate 201 includes a first axis Y and a second axis X that form central axes of the heat reflection assembly 200. The first axis Y is perpendicular to the second axis X in the plane of the reflector plate 201. A ring 213 illustrates where the edge of a substrate 117 (FIG. 1) is in relation to the heat reflection assembly 200.

The reflector plate 201 includes a shaft aperture 203 and a first surface 210. The reflector plate 201 is a metallic plate. For example, in one or more embodiments the reflector plate 201 is an aluminum (Al) plate. In yet another example, the reflector plate 201 is a stainless steel plate.

The shaft aperture 203 is disposed at about the center of the reflector plate 201. The shaft aperture 203 is a circular through hole configured to allow the support column 116 (FIG. 1) to translate back and forth, independent of the heat reflection assembly 200 along the vertical axis A1.

The first surface 210 of the reflector plate 201 includes a first region 211 with a first emissivity. The first emissivity of the first region 211 is between about 0.1 to about 0.55, for example, about 0.25.

In one or more embodiments which may be combined with other embodiments, the first surface 210 of the reflector plate 201 includes a second region 212 with a second emissivity different than the first emissivity of the first region 211. In one embodiment, the second emissivity of the second region 212 is less than the first emissivity of the first region 211. The second emissivity of the second region 212 between about 0.05 to about 0.15, for example, about 0.1.

In one or more embodiments which may be combined with other embodiments, the first region 211 is bare aluminum and the second region 212 is a machined aluminum surface with a second emissivity different than the first emissivity of the first region 211.

In one or more embodiments which may be combined with other embodiments, first region 211 is formed by a coating placed on the first surface 210. The first surface 210 is then partially machined to form the second region 212. The coating remains on the first region 211 after machining but is not on the second region 212. The coating on the first region 211 may be used to enhance a uniformity of the first emissivity of the first region 211, and the machining operation may be used to form and enhance a uniformity of the second emissivity of the second region 212. For example the machining operation creates a finish with about 30 micro inches to about 40 micro inches, for example about 32 micro inches or better. In some embodiments, the coating disposed on and in the first region 211 is a uniform emissivity coating. In some embodiments, the coating disposed on and in the first region 211 is creates an emissivity gradient. In some embodiments, the coating disposed on and in the first region 211 is aluminum oxide.

The second region 212 has a surface area less than the surface area of the first region 211. For example, the surface area of the second region 212 is between about 1% to about 25% of the first surface 210.

While illustrated as an annular sector, the second region 212 may be a circle, a square, a rectangle, a triangle, an ellipse, a trapezoid, a ring, an annulus, or any combination thereof. In one or more embodiments which may be combined with other embodiments the second region 212 is a machined aluminum surface.

In one or more embodiments which may be combined with other embodiments, the second region 212 is disposed along the first axis Y and the first tuning element 221 is disposed along the second axis X. In one or more embodiments which may be combined with other embodiments, the second region 212 is disposed at a first angle from the first axis Y and the first tuning element 221 is disposed at a second angle from the second axis X. The first angle is between 5° to about 175° from the first axis Y. The second angle is between 5° to about 175° from the second axis X.

In one or more embodiments which may be combined with other embodiments, the one or more tuning elements 220 includes a second tuning element 222 such that the one or more tuning elements 220 are two or more tuning elements 221, 222 disposed radially outward of the shaft aperture 203 of the reflector plate 201. In one or more embodiments which may be combined with other embodiments, two or more tuning elements 221, 222 are disposed along the second central axis X. The second tuning element 222 is disposed on the opposite side of first axis Y from the first tuning element 221. For example, the first tuning element 221 and the second tuning element 222 are about equally distant from the first axis Y.

In one or more embodiments which may be combined with other embodiments, the second region 212 is disposed between the first tuning element 221 and the second tuning element 222. In one or more embodiments which may be combined with other embodiments, the heat reflection assembly 200 includes two tuning elements 221, 222 disposed on the first surface 210 of the reflector plate 201. The two tuning elements 221, 222 are mirrored shapes along the first axis Y and disposed along the second axis X such that the second tuning element 222 and the first tuning element 221 have about the same shape.

In one or more embodiments which may be combined with other embodiments the reflector plate 201 is an aluminum plate where the first region 211 of the first surface 210 is an unfinished surface and the second region 212 is a machined aluminum surface configured to have a lower emissivity than the first region 211. The machined aluminum surface has a roughness range of about 30 micro inches to about 40 micro inches, for example about 32 micro inches or better. The second region 212 is disposed on the first axis Y such that the second region 212 is disposed between the first tuning element 221 and second tuning element 222.

Figure 3:
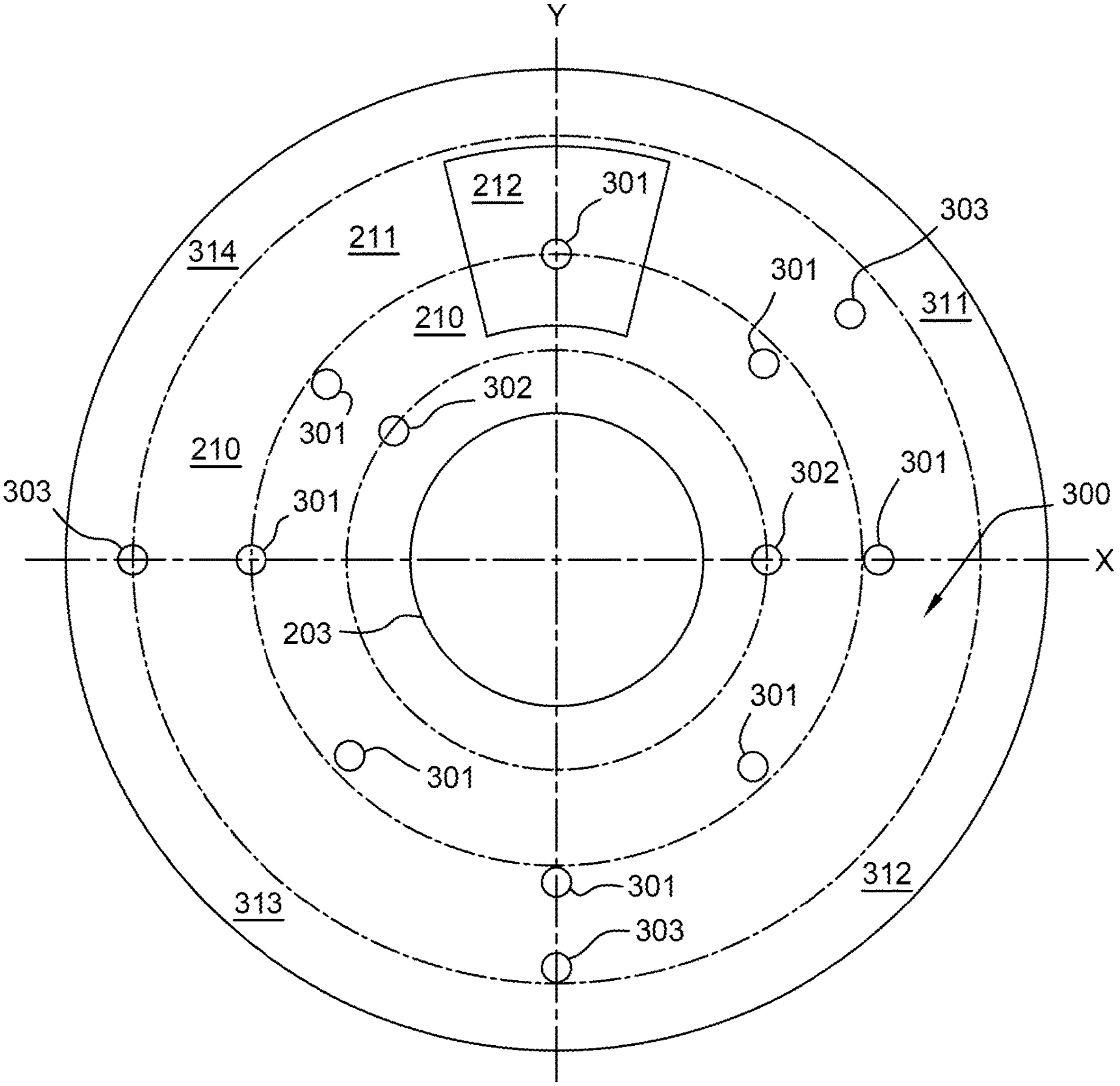
FIG. 3 is a schematic top view of an exemplary reflector plate according to one or more embodiments.

FIG. 3 is a schematic top view of a reflector plate 201 according to one or more embodiments.

The reflector plate 201 includes one or more tuning apertures 300. The one or more tuning apertures 300 are through holes through the reflector plate 201 and are configured to receive the one or more tuning elements 220 (FIG. 2). The tuning apertures 300 may include a first set of tuning apertures 301, a second set of tuning apertures 302, and a third set of tuning apertures 303. In one or more embodiments which may be combined with other embodiments the first set of tuning apertures 301 is radially between the second set of tuning apertures 302 and third set of tuning apertures 303, such that the second set of tuning apertures 302 is disposed radially inward of the first set of tuning apertures 301.

The one or more tuning apertures 300 enable consistent placement and indexing of the one or more tuning elements 220, thereby enhancing deposition uniformity.

The first and second axes Y, X form four quadrants 311, 312, 313, 314. In one or more embodiments, the first region 211 of the first surface 211 extends into the four quadrants 311, 312, 313, 314 and the second region 212 is disposed in two or less adjacent quadrants. For example, about half the second region 212 is disposed in the first quadrant 311 and about half the second region 212 is disposed in the fourth quadrant 314, while the first region 211 partially extends into each of the four quadrants 311, 312, 313, 314.

In one or more embodiments which may be combined with other embodiments, each quadrant has an equal number of tuning apertures 300. In one or more embodiments which may be combined with other embodiments, each tuning aperture of the one or more tuning apertures 300 is bisected by the first and second axes Y, X.

FIG. 3 is illustrative and is not intended to be limiting. In one or more embodiments which may be combined with other embodiments, the first surface 211 may include more of the one or more tuning apertures 300, for example about 12 to about 20 tuning apertures 300. In one or more embodiments which may be combined with other embodiments, the first surface 211 may include fewer of the one or more tuning apertures 300, for example about 2 to about 10 tuning apertures 300.

Figure 4B:
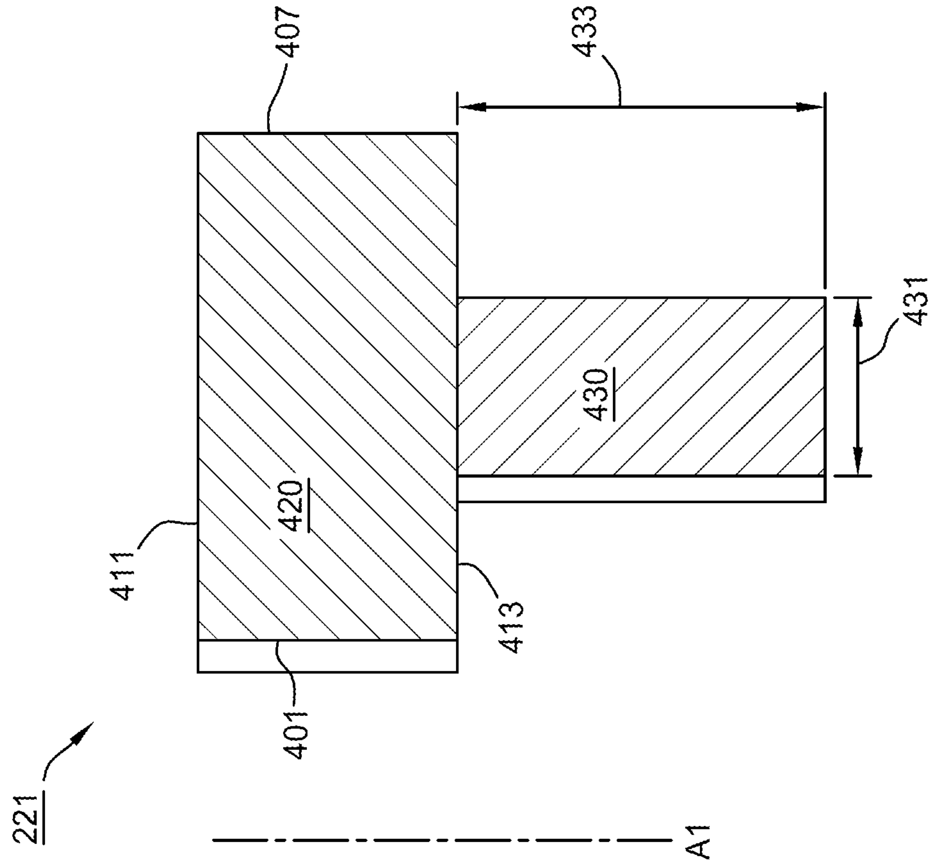
FIGS. 4A and 4B are schematic top and cross-sectional side views of an exemplary tuning element according to one or more embodiments.
Figure 4A:
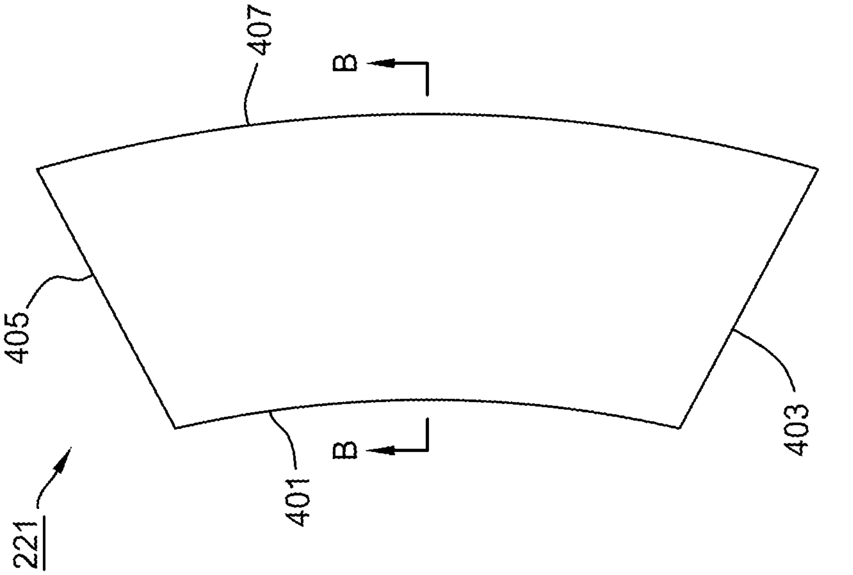

FIGS. 4A and 4B are schematic top and cross-sectional side views respectively of an exemplary tuning element 221 according to one or more embodiments.

As illustrated in FIG. 4A, the first tuning element 221 has an inner face 401, an outer face 407, a first side face 403, and a second side face 405. The inner face 401 is disposed between the outer face 407 and the shaft aperture 203 (FIG. 1)

In one or more embodiments, the first tuning element 221 forms a crescent shape with the inner face 401 and outer face 407 being curved surfaces and the side faces 403, 405 being flat and perpendicular to the reflector plate 201 (FIG. 1). The tuning element 221 may be a metallic material. For example, the one or more tuning elements 220 (FIG. 1) may be aluminum, but other materials are contemplated.

As illustrated in FIG. 4B, the first tuning element 221 includes a body 420. The body 420 includes the faces 401, 403, 405, 407 and also includes a reflecting surface 411 and a support surface 413. The support surface 413 is disposed on the first surface 210 of the reflector plate 201 (FIG. 2). The support surface 413 is disposed opposite the reflecting surface 411 such that the body 420 is disposed between the reflecting surface 411 and the support surface 413.

The reflecting surface 411 is a surface with an emissivity greater than the first region 211 and greater than the second region 212 (FIG. 2), for example the reflecting surface 411 has two or more times the emissivity of the second region 212. In one embodiment, the emissivity of the reflecting surface 411 emissivity is between about 0.4 to about 0.95, for example, about 0.5. In one or more embodiments, the reflecting surface 411 is a coated surface, for example, the reflecting surface 411 is an anodized aluminum surface.

In one or more embodiments which may be combined with other embodiments, the reflecting surface 411 includes a nickel alloy with an emissivity of about 0.5 to about 0.7, for example, about 0.6.

In one or more embodiments which may be combined with other embodiments, the reflecting surface 411 includes an phosphorus enriched nickel oxide coating with an emissivity of about 0.8 to about 0.95, for example, about 0.9.

In one or more embodiments which may be combined with other embodiments, the reflecting surface 411 is a surface with an emissivity about equal to the second region 212 (FIG. 2), for example the reflecting surface 411 has an emissivity lower than the emissivity of the first region 211.

In one or more embodiments which may be combined with other embodiments, each tuning element of the one or more tuning elements 220 may have a reflecting surface 411 with an emissivity different than the emissivity of other tuning elements. For example, a first tuning element has a first emissivity greater than the first region 211, a second tuning element has a second emissivity greater than (e.g., 5% greater than) the first emissivity, and a third tuning element has a third emissivity greater than (e.g., 5% greater than) the second emissivity.

In one or more embodiments, the first tuning element 221 includes an alignment pin 430. The alignment pin 430 and the body 420 form the first tuning element 221. The alignment pin 430 extends from the support surface 413 of the first tuning element 221. The alignment pin 430 is configured to be placed in one of the one or more tuning apertures 300 (FIG. 3). The alignment pin 430 includes a diameter 431 and a height 433. The diameter 431 is between about 3 millimeters and 10 millimeters, for example about 5 millimeters. The height 433 is between about 4 millimeters and 15 millimeters, for example about 8 millimeters.

The alignment pin 430 enables different tuning elements to be placed in the one of the one or more tuning apertures 300 (FIG. 3) for modular and consistent placement.

While the first tuning element 221 is shown with one alignment pin 430, a first tuning element 221 with 2 or more alignment pins 430 is contemplated.

Figure 5B:
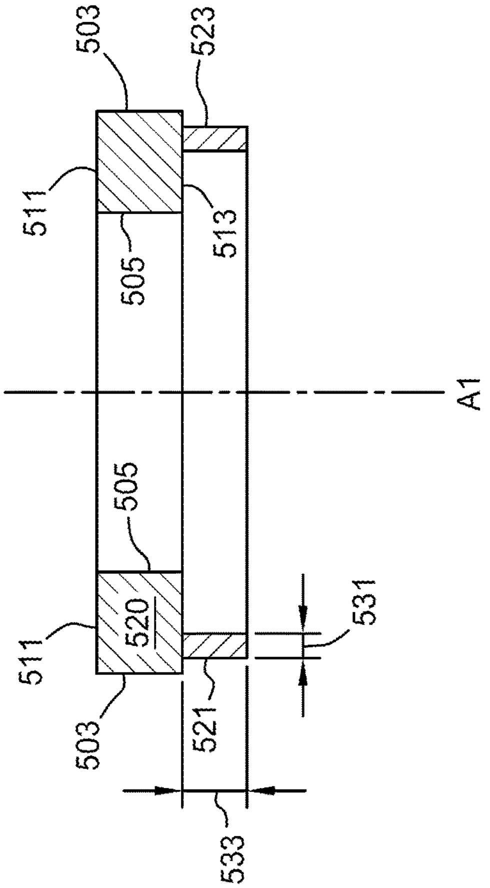
FIGS. 5A and 5B are schematic top and cross-sectional side views of an exemplary tuning ring according to one or more embodiments.
Figure 5A:
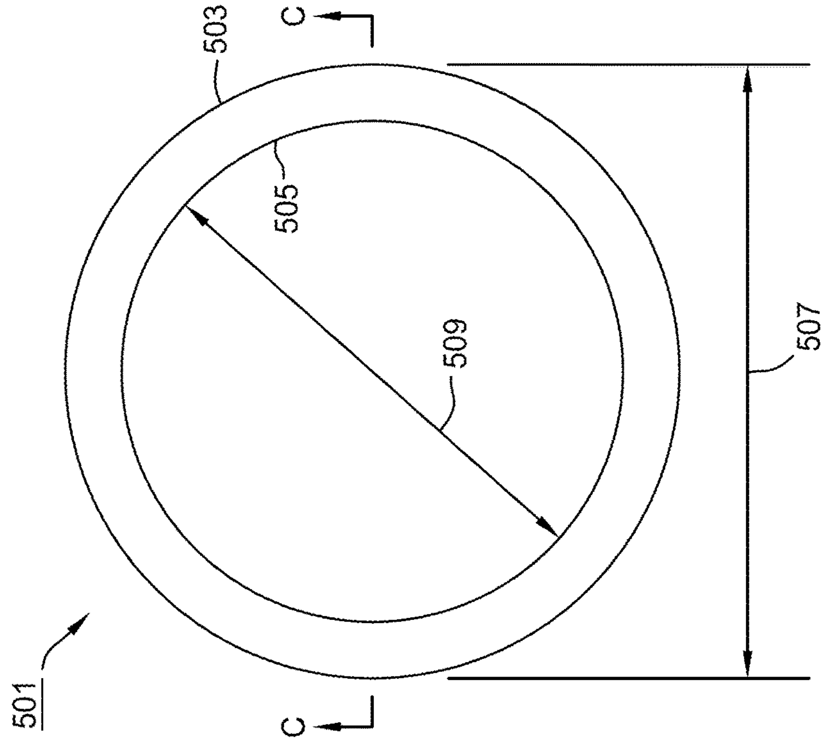

FIGS. 5A and 5B are schematic top and cross-sectional side views respectively of an exemplary tuning ring 500 according to one or more embodiments.

As illustrated in FIG. 5A, in one or more embodiments, the heat reflection assembly 200 (FIG. 2) includes a tuning ring 500. The tuning ring 500 includes an inner face 505 that defines an inner diameter 509. The inner diameter 509 is between about 150 millimeters and 350 millimeters, for example about 275 millimeters.

The tuning ring 500 includes an outer face 503 that defines an outer diameter 507. The outer diameter 507 is between about 250 millimeters and 450 millimeters, for example about 325 millimeters.

As illustrated in FIG. 5B, the tuning ring 500 includes a reflecting surface 511, a body 520, and a support surface 513. The reflecting surface 511 is a surface with an emissivity greater than the first region 211 and greater than the second region 212. The emissivity of the reflecting surface 511 emissivity is between about 0.1 to about 0.95, for example, about 0.9. In one or more embodiments, the reflecting surface 511 is a coated surface, for example, the reflecting surface 511 is an anodized aluminum surface, or other coating. In one or more embodiments, the reflecting surface 511 is a machined surface with an emissivity between about 0.04 and about 0.5.

In one or more embodiments which may be combined with other embodiments, the reflecting surface 511 is a surface with an emissivity about equal to the second region 212 (FIG. 2), for example the reflecting surface 511 has an emissivity lower than the emissivity of the first region 211.

In one or more embodiments, the tuning ring 501 includes one or more alignment pins. For example, the tuning ring 501 includes a first alignment pin 521 and a second alignment pin 523. The alignment pins 521, 523 and the body 520 form the tuning ring 501. The alignment pins 512, 523 extends from the support surface 513 of the tuning ring 501. The alignment pins 512, 523 are configured to be placed in the one or more tuning apertures 300 (FIG. 3). The alignment pins 512 523 includes a diameter 531 and a height 533. The diameter 531 is between about 3 millimeters and 10 millimeters, for example about 5 millimeters. The height 533 is between about 4 millimeters and 15 millimeters, for example about 8 millimeters.

The alignment pins 512 523 enable the tuning ring 501 to index with the one or more tuning apertures 300 (FIG. 3) for modular and consistent placement.

In one or more embodiments, the tuning ring 501 is co-axial with the vertical axis A1. The addition of the tuning ring 501 enhances deposition uniformity because the tuning ring 501 can be sized and/or aligned with the edge of the substrate 117 (FIG. 1) such that the emissivity of the reflecting surface 511 of the tuning ring 501 is adjusted to enhance deposition uniformity across the substrate 117.

Figure 6:
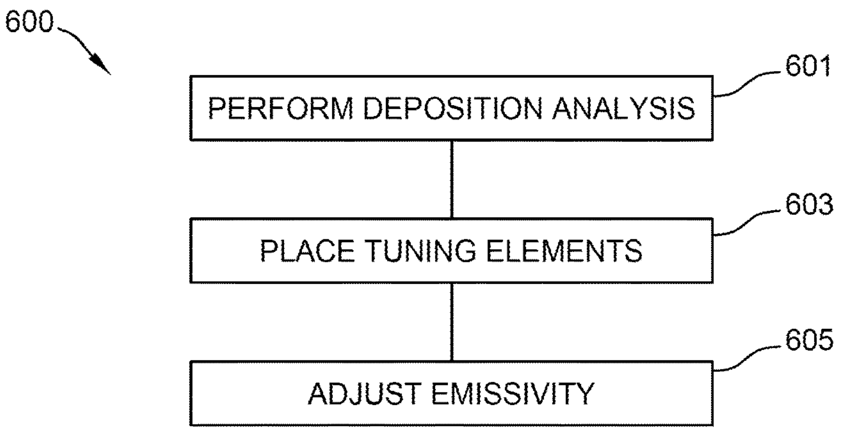
FIG. 6 is a schematic block diagram view of a method of tuning a heat reflection assembly according to one or more embodiments.

FIG. 6 is a schematic block diagram view of a method 600 of tuning a heat reflection assembly 200 according to one or more embodiments.

At operation 601 of the method 600, a deposition on a substrate is analyzed. This analysis includes reviewing where there is greater or less thickness of a deposited material on a substrate.

At operation 603 of the method 600, the heat reflection assembly 200 is modified by adding one or more tuning elements 220, modifying the first surface to form the first region 211 and second region 212 of the first surface 210 of the reflector plate 201, and/or adding a tuning ring 501 to the heat reflection assembly 200.

For example, operation 603 may include disposing one or more tuning elements 220 on the reflector plate 201. Each of the one or more tuning elements 220 includes the reflecting surface 411. The reflecting surface 411 has an emissivity greater than the first region 211 of the heat reflection assembly 200.

Figure 7A:
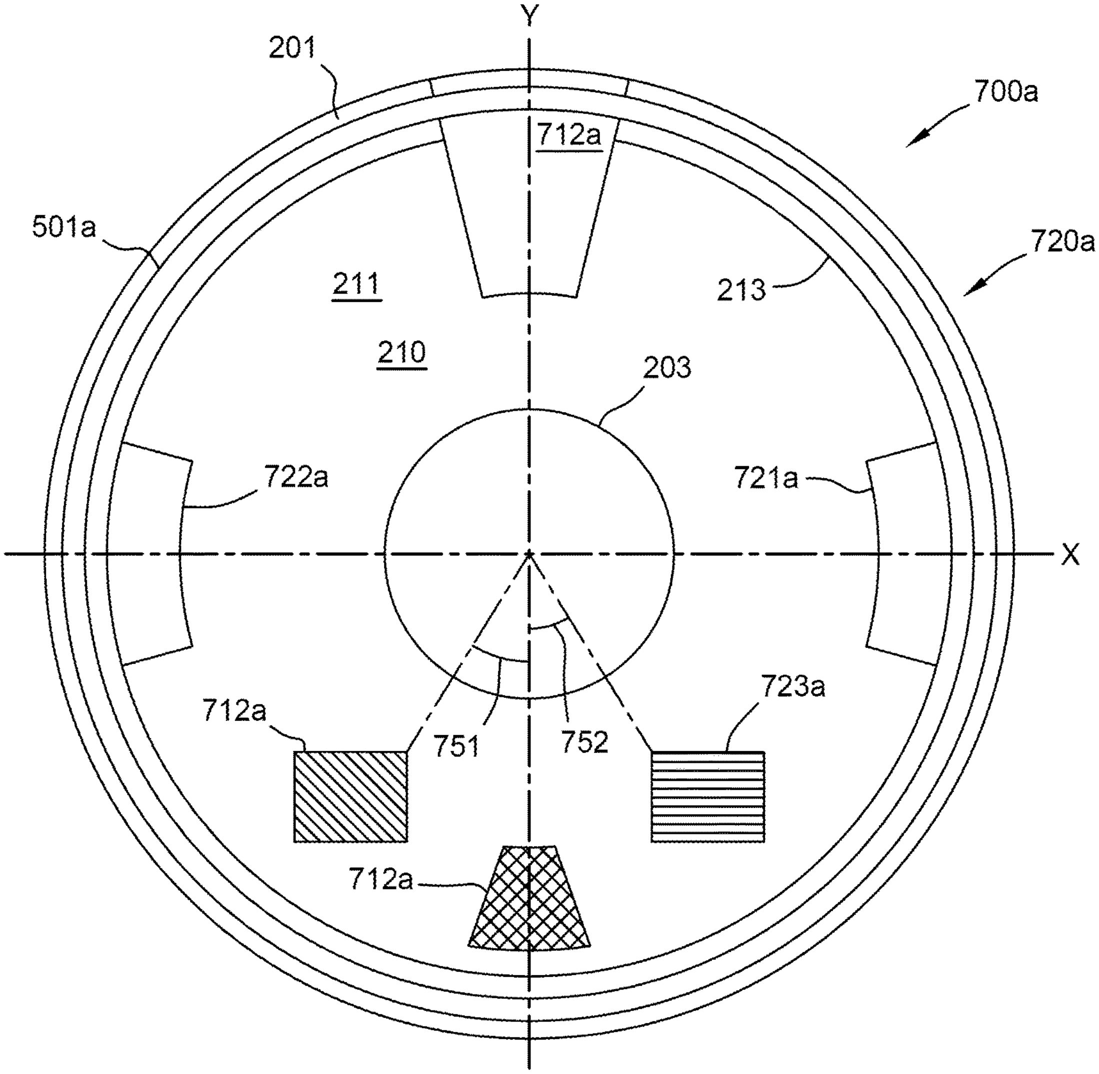
FIGS. 7A-7D are a schematic top views of exemplary heat reflection assemblies according to one or more embodiments.

FIG. 7A is a schematic top view of an exemplary heat reflection assembly 700*a* according to one or more embodiments. The heat reflection assembly 700*a* includes the reflector plate 201 and one or more tuning elements 720*a*. The one or more tuning elements 720*a* include a first tuning element 721*a*, a second tuning element 722*a*, and a third tuning element 723*a*. In one or more embodiments which may be combined with other embodiments, the heat reflection assembly 700*a* includes the tuning ring 501*a*. The one or more tuning elements 720*a* are disposed radially outward of the shaft aperture 203 of the reflector plate 201. The one or more tuning elements 720*a* are disposed radially inward of the tuning ring 501*a*.

In one or more embodiments which may be combined with other embodiments, the tuning ring 501*a* is disposed radially outward of the ring 213 that illustrates the edge of a substrate 117. In other words, the tuning ring 501*a* has an internal diameter larger than a diameter of a substrate.

In one or more embodiments which may be combined with other embodiments, the first surface 210 of the reflector plate 201 includes second regions 712*a* with a second emissivity different than the first emissivity of the first region 211. In one embodiment, the second emissivity of the second regions 712*a* is less than the first emissivity of the first region 211. The second emissivity of the second regions 712*a* between about 0.05 to about 0.15, for example, about 0.1.

The second regions 712*a* have a surface area less than the surface area of the first region 211. For example, the combined surface area of the second regions 712*a* is between about 15% to about 50% of the first surface 210.

The second regions 712*a* may be circles, squares, rectangles, triangles, ellipses, trapezoids, rings, annuluses, or any combination thereof. In one or more embodiments which may be combined with other embodiments the second regions 712*a* are machined aluminum surfaces.

In one or more embodiments which may be combined with other embodiments, some of the second regions 712*a* are disposed along the first axis Y and other second regions 712*a* are disposed at a first angle 751 from the first axis Y. The first angle 751 is between 5° to about 175° from the first axis Y.

In one or more embodiments which may be combined with other embodiments, some of the second regions 712*a* In one or more embodiments which may be combined with other embodiments, one or more tuning elements 720*a*, for example, the third tuning element 723*a*, is disposed at a second angle 752 from the second axis X. The second angle 752 is between 5° to about 175° from the first axis Y.

In one or more embodiments which may be combined with other embodiments, the first tuning element 721*a* has a first emissivity and the second tuning element 722*a* has a second emissivity different than the first emissivity of the first tuning element 721*a*. For example, the first emissivity of the first tuning element 721*a* is greater than the second emissivity of the second tuning element 722*a*.

Figure 7B:
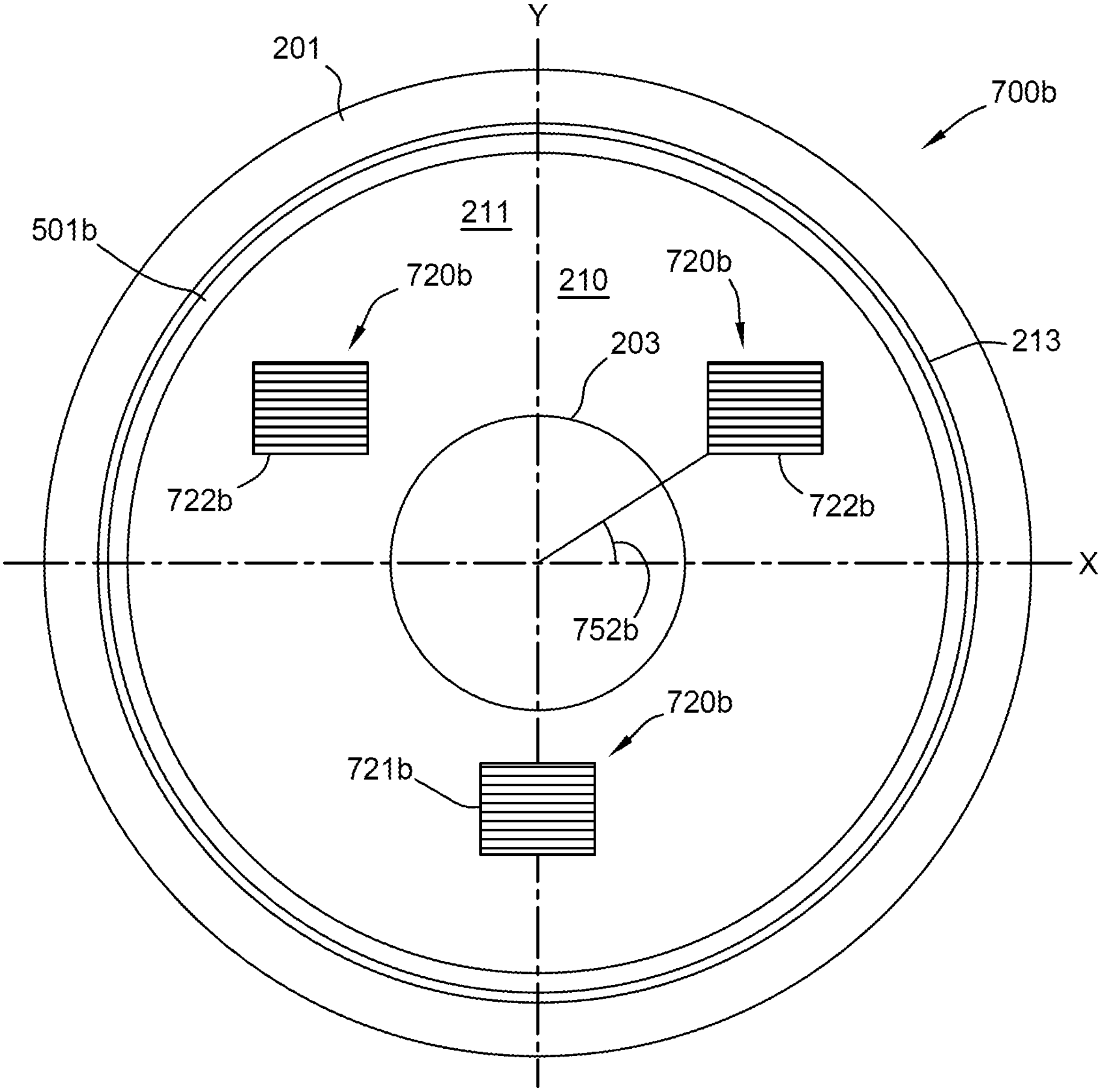

FIG. 7B is a schematic top view of an exemplary heat reflection assembly 700*b* according to one or more embodiments. The heat reflection assembly 700*b* includes the reflector plate 201 and one or more tuning elements 720*b*. The one or more tuning elements 720*b* include a first tuning element 721*b* and a second tuning element 722*b*. In one or more embodiments which may be combined with other embodiments, the heat reflection assembly 700*b* includes the tuning ring 501*b*.

In one or more embodiments which may be combined with other embodiments, the one or more tuning elements 720*b* are disposed radially inward of the tuning ring 501*b*.

In one or more embodiments which may be combined with other embodiments, the tuning ring 501*b* is disposed radially inward of the ring 213 that illustrates the edge of a substrate 117. In other words, the tuning ring 501 has an outer diameter smaller than a diameter of a substrate.

In one or more embodiments which may be combined with other embodiments, the first surface 210 of the reflector plate 201 includes first region 211 disposed over the whole first surface 210.

In one or more embodiments which may be combined with other embodiments, the first tuning element 721*b* is disposed on the first axis Y. As show, the one or more tuning elements 720*b* includes two second tuning elements 722*b*. The second tuning elements 722*b* are disposed opposite the first tuning element 221*b* such that the second tuning elements 722*b* are disposed on the opposite side of the second axis X from the first tuning element 221*b*.

In one or more embodiments which may be combined with other embodiments, the second tuning element 722*b*, is disposed at a second angle 752*b* from the second axis X. The second angle 752 is between 5° to about 85° from the second axis X such that the second tuning element 722*b* is mirrored along the first axis Y.

Figure 7C:
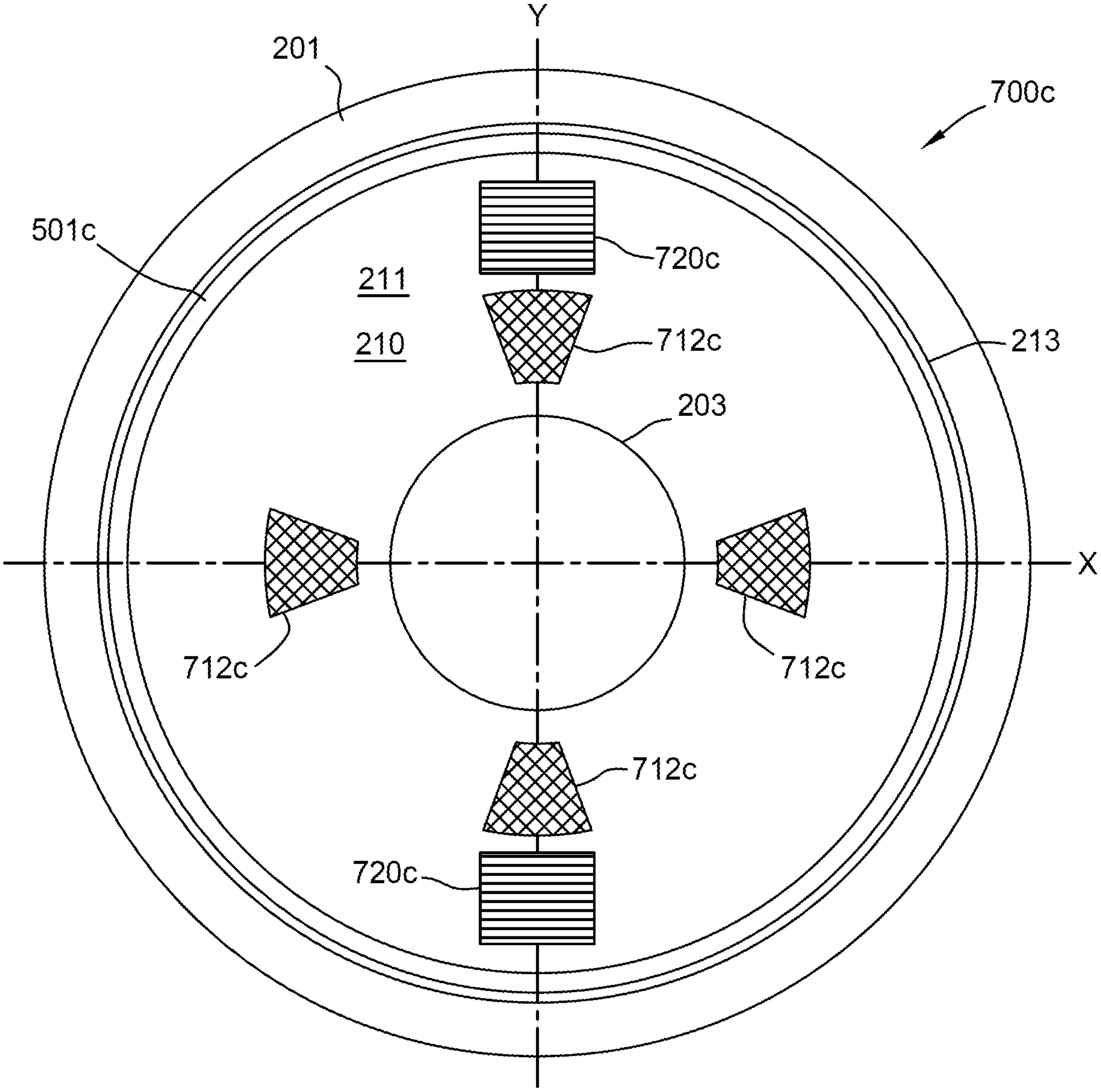

FIG. 7C is a schematic top view of an exemplary heat reflection assembly 700*c* according to one or more embodiments. The heat reflection assembly 700*c* includes the reflector plate 201 and one or more tuning elements 720*c*. In one or more embodiments which may be combined with other embodiments, the heat reflection assembly 700*c* includes the tuning ring 501*c*.

In one or more embodiments which may be combined with other embodiments, the first surface 210 of the reflector plate 201 includes second regions 712*c*. The second regions 712*c* are disposed along at least one of the first axis Y or the second axis X. The second regions 712*c* are disposed radially inward of the one or more tuning elements 720*c*. The one or more tuning elements 720*c* are disposed along the first axis Y and between the tuning ring 501*c* and the second regions 712*c*.

Figure 7D:
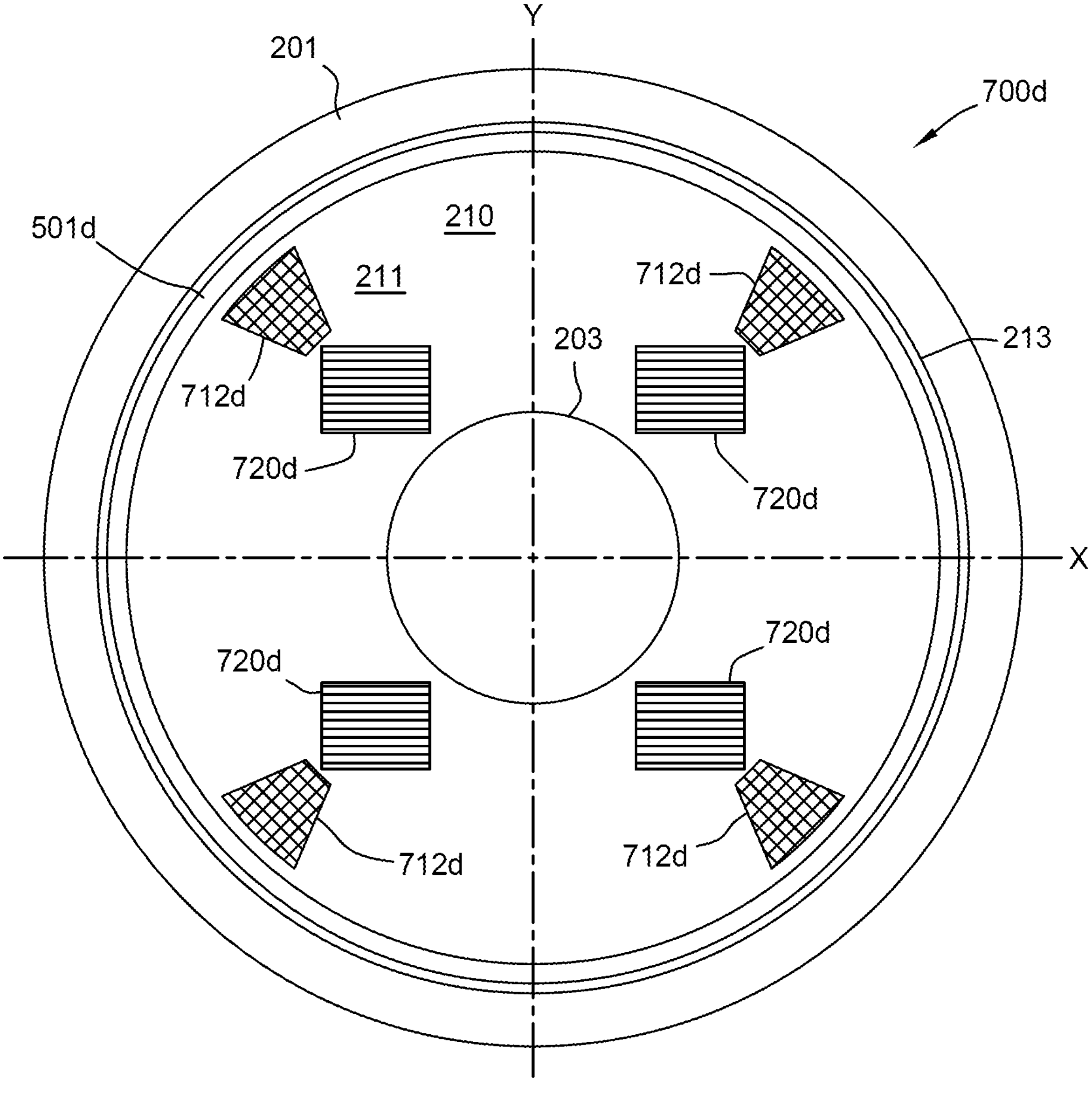

FIG. 7D is a schematic top view of an exemplary heat reflection assembly 700*d* according to one or more embodiments. The heat reflection assembly 700*d* includes the reflector plate 201 and one or more tuning elements 720*d*. In one or more embodiments which may be combined with other embodiments, the heat reflection assembly 700*d* includes the tuning ring 501*d*.

In one or more embodiments which may be combined with other embodiments, the first surface 210 of the reflector plate 201 includes second regions 712*d*. The second regions 712*d* are disposed radially between of the first axis Y or the second axis X. The second regions 712*d* are disposed radially outward of the one or more tuning elements 720*d* and between the tuning ring 501*c* and the one or more tuning elements 720*d*. The one or more tuning elements 720*d* are disposed radially between the first axis Y or the second axis X.

In one or more embodiments which may be combined with other embodiments, the one or more tuning elements 720*d* are disposed about radially equidistant from the first axis Y or the second axis X. In one or more embodiments which may be combined with other embodiments, the second regions 712*d* are disposed about radially equidistant from the first axis Y or the second axis X.

In one or more embodiments, the one or more tuning elements 220 may be disposed such that the second region 212 is disposed between two tuning elements. An optional second deposition on a substrate may occur at operation 603 for further analysis.

At operation 605 of the method 600, the emissivity of the first region 211, second region 212, reflecting surface 411 of the one or more tuning elements, and/or the reflecting surface 511 of the tuning ring 501 may be adjusted to further tune the heat reflection assembly 200 for enhanced deposition uniformity. The adjustment of emissivity may include modifying the first region 211 and/or second region 212 by machining the aluminum surface of that region.

Benefits of the present disclosure include modular tuning of a deposition by the heat reflection assembly 200; enhancing repeatability of the placement of tuning elements 220; adjusting of process parameters (such gas substrate temperature, and/or deposition thickness); increasing throughput and efficiency; and reducing chamber downtime.

It is contemplated that one or more aspects disclosed herein may be combined. As an example, one or more aspects, features, components, operations, and/or properties of the processing chamber 100, the one or more tuning elements 220 in FIG. 2, the reflective surface 411 in FIG. 4, the tuning ring 501 in FIG. 5, and/or the method 600 shown in FIG. 6, maybe be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A heat reflection assembly for semiconductor manufacturing, the heat reflection assembly comprising:
- a reflector plate, the reflector plate comprising:
  - a first surface having a first region with a first emissivity and a second region with a third emissivity less than the first emissivity;
  - a shaft aperture; and
  - one or more tuning apertures disposed around the shaft aperture; and
- a first tuning element disposed on the first surface of the reflector plate, the first tuning element comprising a body having a reflecting surface and an alignment pin disposed opposite of the reflecting surface and configured to be placed in one of the one or more tuning apertures, the reflecting surface having a second emissivity different than the first emissivity.

2. The heat reflection assembly of claim 1, further comprising a tuning ring, the tuning ring disposed on the reflector plate and about co-axial with the shaft aperture, wherein the tuning ring has an emissivity different than the first emissivity.

3. The heat reflection assembly of claim 1, further comprising a second tuning element, the second tuning element disposed opposite the first tuning element.

4. The heat reflection assembly of claim 3, wherein the second region is disposed between the first tuning element and the second tuning element.

5. The heat reflection assembly of claim 3, wherein the second tuning element and the first tuning element have about the same shape.

6. The heat reflection assembly of claim 1, wherein the reflecting surface comprises anodized aluminum.

7. The heat reflection assembly of claim 1, wherein the first tuning element is in a crescent shape.

8. A processing chamber for semiconductor manufacturing, the processing chamber comprising:
- a substrate support disposed in a processing volume of the processing chamber, the substrate support comprising a support column and a heater disposed within the substrate support;
- a heat reflection assembly comprising:
  - a reflector plate, the reflector plate comprising:
    - a first surface having a first region with a first emissivity and a second region with a third emissivity less than the first emissivity;
    - a shaft aperture; and
    - one or more tuning apertures disposed around the shaft aperture; and
  - a first tuning element disposed on the first surface of the reflector plate, the first tuning element comprising a body having a reflecting surface and an alignment pin disposed opposite of the reflecting surface and configured to be placed in one of the one or more tuning apertures, the reflecting surface having a second emissivity different than the first emissivity.

9. The processing chamber of claim 8, wherein the reflector plate is an aluminum plate and the second region is a machined aluminum surface.

10. The processing chamber of claim 8, wherein the reflector plate further comprises a second tuning element, the first and second tuning elements disposed radially outward of a shaft aperture of the reflector plate.

11. The processing chamber of claim 10, wherein the reflector plate further comprises a tuning ring having an emissivity greater than the first emissivity, the tuning ring is co-axial with a shaft aperture of the reflector plate.

12. The processing chamber of claim 10, wherein the second tuning element comprises an alignment pin, the alignment pin disposed opposite of the reflecting surface, the alignment pin configured to be disposed within one of the one or more tuning apertures of the reflector plate.

13. A processing chamber for semiconductor manufacturing, the processing chamber comprising:
- a substrate support disposed in a processing volume of the processing chamber, the substrate support comprising a support column and a heater disposed within the substrate support;
- a heat reflection assembly, wherein the heat reflection assembly is configured to enable movement of the substrate support independent of the heat reflection assembly, the heat reflection assembly comprising:
  - a reflector plate, the reflector plate comprising:
    - a first surface having a first region having a first emissivity and a second region having a third emissivity different than the first emissivity;
    - a shaft aperture; and
    - one or more tuning apertures disposed radially outward of the shaft aperture; and
  - a first tuning element disposed on the first surface of the reflector plate, the first tuning element comprising a body having a reflecting surface and an alignment pin disposed opposite of the reflecting surface and configured to be placed in one of the one or more tuning apertures, the reflecting surface having a second emissivity greater than the first emissivity.

14. The processing chamber of claim 13, wherein the reflector plate further comprises four quadrants, wherein the first region is partially in each of the four quadrants.

15. The processing chamber of claim 13, wherein the reflector plate further comprises a second tuning element disposed opposite a central axis from the first tuning element.

16. The processing chamber of claim 15, wherein the second tuning element has an emissivity that is greater than an emissivity of the first tuning element.

17. The processing chamber of claim 15, wherein the second tuning element comprises an alignment pin configured to be placed in one of the one or more tuning apertures.

* * * * *